United States Patent
Ozawa et al.

(10) Patent No.: US 7,134,607 B2
(45) Date of Patent: Nov. 14, 2006

(54) COOLING STRUCTURE AND COOLING METHOD FOR ELECTRONIC EQUIPMENT

(75) Inventors: Fujio Ozawa, Kawasaki (JP); Junichi Hayama, Kawasaki (JP); Tetsuya Murayama, Kawasaki (JP); Hiroyuki Abe, Kawasaki (JP); Naoya Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/034,138

(22) Filed: Jan. 12, 2005

(65) Prior Publication Data

US 2005/0122680 A1    Jun. 9, 2005

Related U.S. Application Data

(63) Continuation of application No. PCT/JP03/01880, filed on Feb. 20, 2003.

(51) Int. Cl.
F24F 7/00 (2006.01)
F25D 23/12 (2006.01)
H05K 7/20 (2006.01)

(52) U.S. Cl. .................... 236/49.3; 62/259.2; 361/688; 361/695

(58) Field of Classification Search ............... 236/49.3; 62/259.2; 361/687, 695, 688, 689, 676, 724, 361/728
See application file for complete search history.

(56) References Cited

U.S. PATENT DOCUMENTS 4,774,631 A * 9/1988 Okuyama et al. ........... 361/695

5,928,076 A    7/1999 Clements et al.

FOREIGN PATENT DOCUMENTS

| JP | 3-164999 | 7/1991 |
|---|---|---|
| JP | 4-157798 | 5/1992 |
| JP | 5-95063 | 4/1993 |
| JP | 7-162180 | 6/1995 |
| JP | 8-88304 | 4/1996 |
| JP | 11-163568 | 6/1999 |
| JP | 2000-346512 | 12/2000 |

* cited by examiner

Primary Examiner—Chen-Wen Jiang
(74) Attorney, Agent, or Firm—Katten Muchin Rosenman LLP

(57) ABSTRACT

A cooling structure for electronic equipment including a plurality of electronic devices superposed on each other, each of the electronic devices having a lower part where an air ventilation part configured to ventilate air so as to cool the electronic device is provided, the cooling structure includes an air intake and exhaust hole forming part which is formed at an upper part of a first one of the electronic devices and below the air ventilation part of a second one of the electronic devices provided on the first electronic device. Air outside of the electronic equipment is taken into an inside of the second electronic device or air inside of the first electronic device is exhausted to the outside of the electronic equipment via the air intake and exhaust hole forming part, so that an amount of the air ventilated inside of the first electronic device is controlled.

12 Claims, 11 Drawing Sheets

FIG.13

| | | CASE OF FIG.12 -(a) | CASE OF FIG.12 -(b) | CASE OF FIG.12 -(c) | CASE OF FIG.12 -(d) | CASE OF FIG.12 -(e) | CASE OF FIG.12 -(f) | CASE OF FIG.12 -(g) | CASE OF FIG.12 -(h) | CASE OF FIG.12 -(i) |
|---|---|---|---|---|---|---|---|---|---|---|
| ELECTRONIC DEVICE MAIN PART 380 | UPPER PART | 25.9 | 24.9 | 24.7 | 30.8 | 27.1 | 26.6 | 34.3 | 37.1 | 38 |
| | CENTER PART | 23.3 | 21.5 | 22.5 | 26.7 | 25.7 | 29 | 34.1 | 34.7 | 37 |
| | LOWER PART | 9.2 | 9.1 | 9.1 | 9.5 | 9.4 | 9.4 | 10 | 10.2 | 10.4 |
| ELECTRONIC DEVICE MAIN PART 280 | UPPER PART | 16.4 | 13.4 | 13.1 | 17.3 | 16.3 | 16 | 16.6 | 15.8 | 15.6 |
| | CENTER PART | 18.6 | 17.4 | 18 | 18.6 | 17.7 | 18.5 | 18 | 16.5 | 16.4 |
| | LOWER PART | 8.1 | 7.9 | 7.8 | 8.7 | 8.6 | 8.4 | 10 | 10.3 | 10.4 |
| ELECTRONIC DEVICE MAIN PART 180 | UPPER PART | 13.2 | 11 | 11 | 13.5 | 12.5 | 11.9 | 15.2 | 15.7 | 15.9 |
| | CENTER PART | 10.6 | 9.6 | 10.3 | 12 | 11.4 | 14 | 14.5 | 14.1 | 15.1 |
| | LOWER PART | 0.1 | 0.1 | 0.1 | 0.1 | 0.1 | 0.1 | 0.1 | 0.1 | 0.1 |

|  |  | NUMERICAL APERTURE ||||| 
|---|---|---|---|---|---|---|
|  |  | 0% | 10% | 20% | 30% | 40% |
| ELECTRONIC DEVICE MAIN PART 380 | UPPER PART | 26.4 | 24.6 | 24.3 | 24.7 | 24.9 |
|  | CENTER PART | 26.8 | 22.9 | 21.9 | 21.6 | 21.5 |
|  | LOWER PART | 11.5 | 10 | 9.4 | 9.2 | 9.1 |
| ELECTRONIC DEVICE MAIN PART 280 | UPPER PART | 15.9 | 14.3 | 13.6 | 13.5 | 13.4 |
|  | CENTER PART | 16.5 | 16.2 | 16.9 | 17.3 | 17.4 |
|  | LOWER PART | 8.7 | 8 | 7.9 | 7.9 | 7.9 |
| ELECTRONIC DEVICE MAIN PART 180 | UPPER PART | 13.5 | 10.9 | 10.7 | 10.8 | 11 |
|  | CENTER PART | 14.3 | 10.2 | 9.8 | 9.6 | 9.6 |
|  | LOWER PART | 0.1 | 0.1 | 0.1 | 0.1 | 0.1 |

COOLING STRUCTURE AND COOLING METHOD FOR ELECTRONIC EQUIPMENT

CROSS-REFERENCE TO RELATED APPLICATION

This application is a U.S. continuation application filed under 35 USC 111(a) and claiming benefit under 35 USC 120 and 365(c) of PCT application No. JP2003/001880 filed on Feb. 20, 2003. The foregoing application is hereby incorporated by reference.

BACKGROUND OF THE INVENTION

1. Field of the Invention

The present invention generally relates to cooling structures and cooling methods for electronic equipment, and more particularly, to a cooling structure and a cooling method for electronic equipment which is composed of a plurality of electronic devices superposed on each other.

2. Description of the Related Art

A structure where plural electronic devices are superposed on each other in a rack is applied for electronic equipment such as telecommunication equipment. More specifically, plural plug-in units wherein electronic parts such as an integrated circuit (IC) or a large scale integration circuit (LSI) are mounted on a printed wiring board are received in a shelf. The plug-in unit is plugged in a back board provided in the shelf by a connector of the plug-in unit so that a single electronic device is formed.

In the above-mentioned electronic equipment, the temperature of an inside of the electronic equipment rises due to generation of heat of the electronic parts or others. Because of this, a forced air type of cooling means is applied in order to keep the temperature of the inside of the electronic equipment as a desirable temperature. More specifically, a fan having a high cooling ability is installed and operated into the electronic equipment so that air is forcibly taken in the electronic equipment from the outside and circulated inside of the electronic equipment. As a result of this, the electronic parts which generate heat are cooled and then the heat is discharged outside.

Conventionally, the operation of the fan, which forcibly cools the inside of the electronic equipment wherein plural electronic devices are superposed on each other in the rack, is determined based on an air flow whereby the electronic devices can be cooled so that the temperature in the electronic equipment is prevented from exceeding a temperature at which it is guaranteed that the electronic devices can be properly operated, namely an operation guarantee temperature, on the assumption that the greatest number of the plug-in units are installed in the shelf so that a calorific value generated when the greatest number of the electronic devices are installed in the rack, namely a maximum calorific value, is generated.

According to the above-discussed conventional forced air type cooling means, the fan is set up and always driven so that the air flow corresponding to the maximum calorific value is always generated regardless of the amount of the rack actually occupied by the electronic devices. Therefore, the fan always consumes the maximum amount of consumption electric power.

However, as a matter of fact, the greatest number of the plug-in units is not always installed in the shelf. Hence, there are a lot of cases wherein the calorific power generated by the electronic equipment does not reach to the maximum calorific power.

According to the conventional forced air type cooling means, even in this case, the fan is set up and always driven so that the air flow corresponding to the maximum calorific value is always generated so that the fan generates air flow larger than necessary. Therefore, in the conventional forced air type cooling means, there is waste of electric power.

Meanwhile, in other conventional art, a necessary number of temperature sensors are provided at proper parts in the electric equipment. By this sensor, the temperature of parts generating heat on the printed circuit board is always detected directly or indirectly. In addition, in this art, in order to make the temperature in the electronic equipment be equal to a setting temperature, a signal corresponding to a difference between the temperature in the electronic equipment and the setting temperature is output to a rotation control part.

SUMMARY OF THE INVENTION

Accordingly, it is a general object of the present invention to provide a novel and useful cooling structure and cooling method for electronic equipment, in which one or more of the problems described above are eliminated.

Another and more specific object of the present invention is to provide a cooling structure and a cooling method for electronic equipment, which is composed of a plurality of electronic devices superposed on each other, whereby the consumption of electric power for driving a fan to forcibly air cool the electronic device can be reduced while the operation guarantee temperature of the electronic device is maintained.

The above object of the present invention is achieved by a cooling structure for electronic equipment including a plurality of electronic devices superposed on each other, each of the electronic devices having a lower part where an air ventilation part configured to ventilate air so as to cool the electronic device is provided, the cooling structure including:

an air intake and exhaust hole forming part which is formed at an upper part of a first one of the electronic devices and below the air ventilation part of a second one of the electronic devices provided on the first electronic device;

wherein air outside of the electronic equipment is taken into an inside of the first electronic device or air inside of the second electronic device is exhausted to the outside of the electronic equipment via the air intake and exhaust hole forming part, so that an amount of the air ventilated inside of the first electric device is controlled.

The electronic device may further include:

a temperature sensing part configured to sense a temperature inside of the electronic device; and an air ventilation control part configured to control an operation of the air ventilation part, so that the temperature of the inside of the electronic device sensed by the temperature sensing part becomes equal to a designated operation guarantee temperature.

The above object of the present invention is also achieved by a cooling method for electronic equipment including a plurality of electronic devices superposed on each other, the electronic equipment being cooled by ventilating air into the electric device, the cooling method including the step of:

controlling the ventilation of the air in the electric device by taking air outside of the electronic equipment into an inside of the electronic device or exhausting air inside of the electronic device to the outside of the electronic equipment, so that the temperature of the inside of the electronic device sensed by a temperature sensing part becomes equal to a designated operation guarantee temperature.

Other objects, features, and advantages of the present invention will become more apparent from the following detailed description when read in conjunction with the accompanying drawings.

BRIEF DESCRIPTION OF THE DRAWINGS

FIG. 13 is a table showing results of the first simulation under the conditions shown in FIG. 12;

DETAILED DESCRIPTION OF THE PREFERED EMBODIMENTS

A description is next given, with reference to FIG. 1 through FIG. 15, of embodiments of the present invention. In the following embodiment, communication equipment is explained as an example of electronic equipment.

Figure 1:
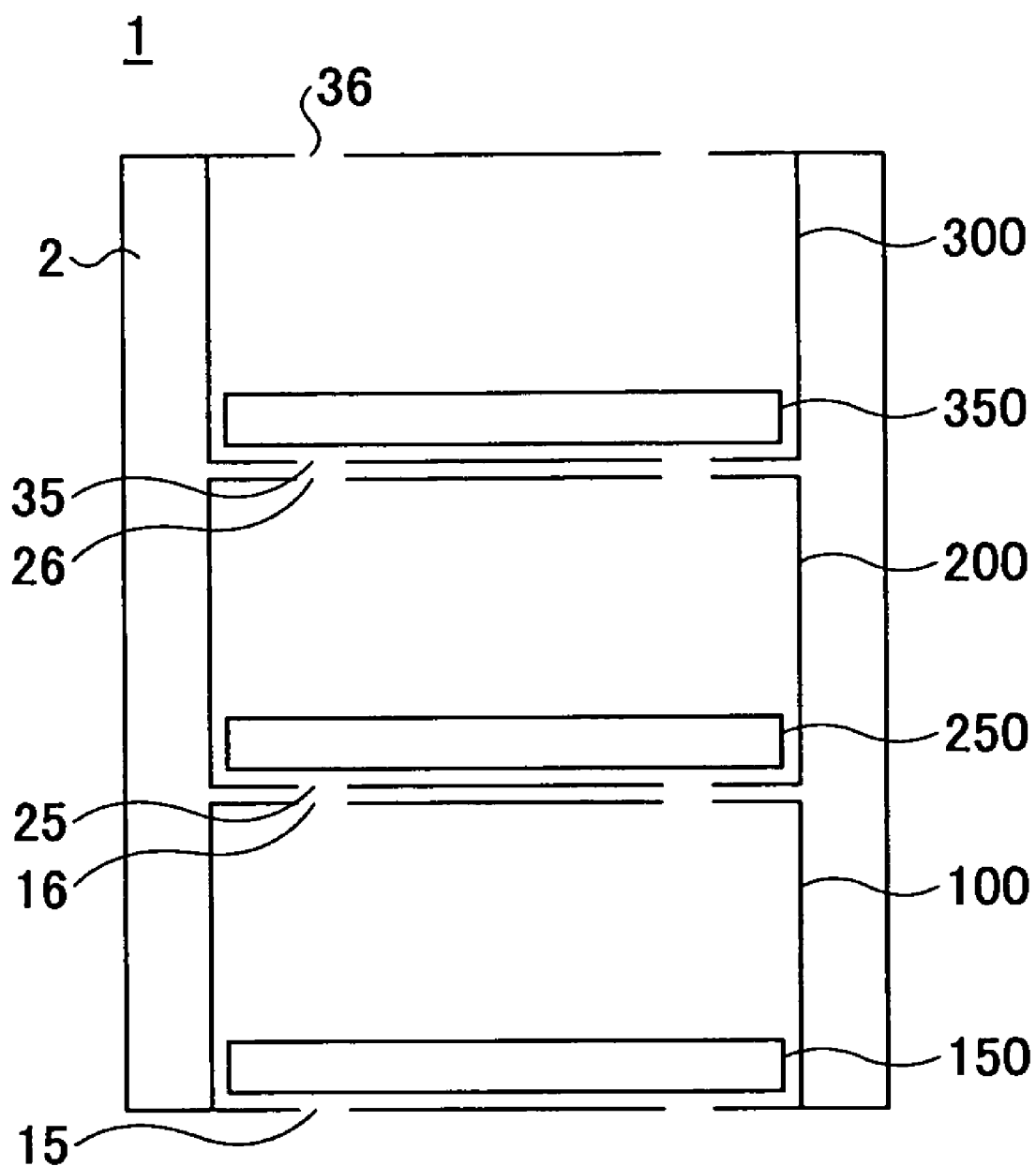
FIG. 1 is a schematic front view showing communication equipment 1.

FIG. 1 is a schematic front view showing communication equipment 1.

Referring to FIG. 1, communication equipment 1 of the present invention has a rack 2 where plural shelves are provided in a vertical direction of the communication equipment 1. Electronic devices 100, 200, and 300 are respectively provided on the shelves. Hence, the electronic devices 100, 200, and 300 are superposed on each other in the vertical direction in order from a bottom part of the communication equipment 1. Fan units 150, 250, and 350 configured to cool insides of the electronic devices 100, 200, and 300 are respectively inserted and installed in lower parts of the electronic devices 100, 200, and 300. Air intake hole forming parts 15, 25, and 35 are formed on bottom surfaces of the electronic devices 100, 200, and 300. Air exhaust hole forming parts 16, 26, and 36 are formed on upper surfaces of the electronic devices 100, 200, and 300.

Based on drive of the fan units 150, 250, and 300, air is ventilated (circulated) inside of the electronic devices 100, 200, and 300 so that the inside of the electronic devices 100, 200, and 300 is cooled.

Figure 2:
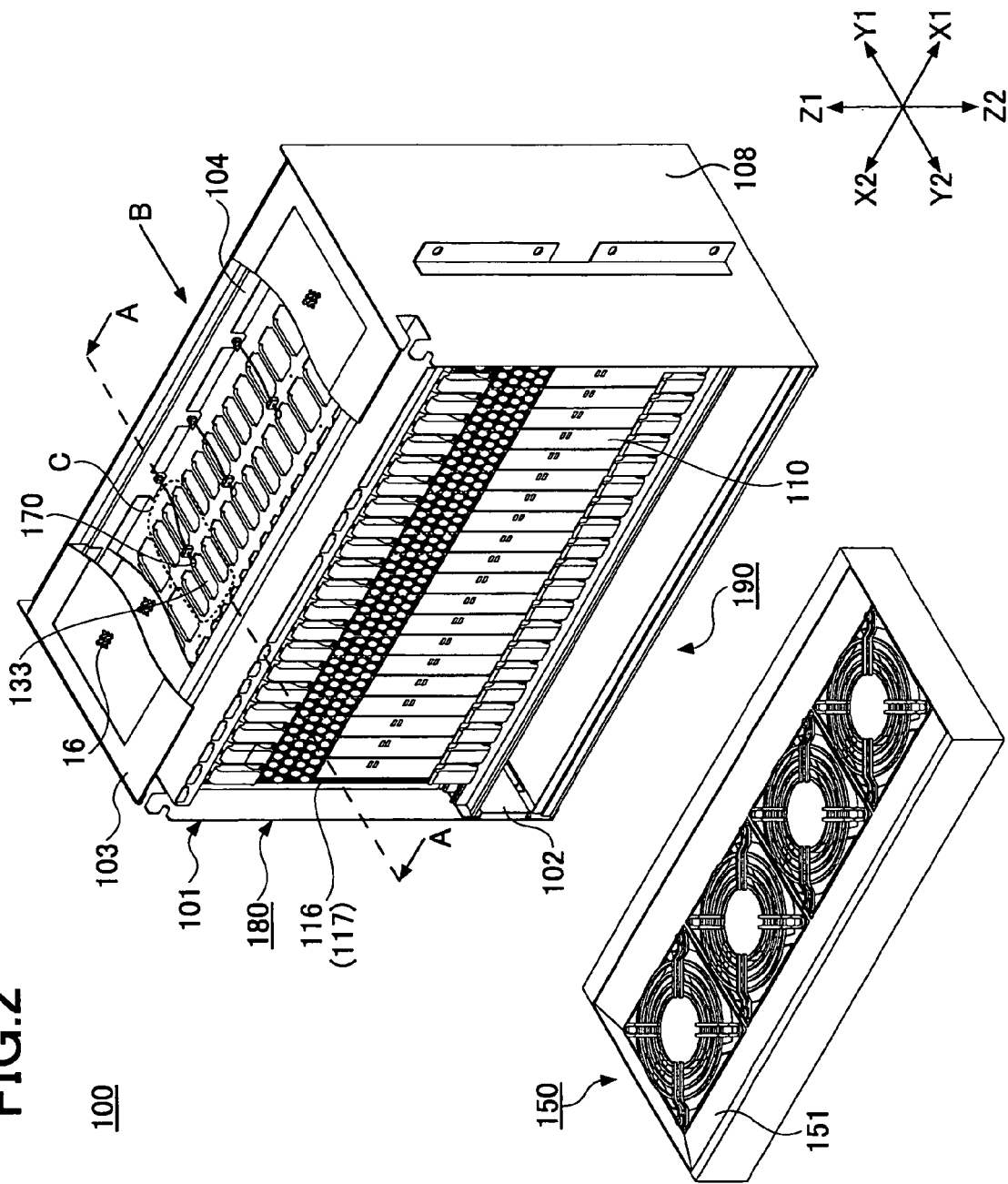
FIG. 2 is a view showing a structure of the electronic device 100 shown in FIG. 1.

FIG. 2 is a view showing a structure of the electronic device 100 shown in FIG. 1. More specifically, FIG. 2 is a perspective view of the electronic device 100 in a state before the fan unit 150 is inserted and installed into the electronic device 100. In FIG. 2, an illustration of a part of ceiling plate 103 provided on the upper surface (end surface in the Z1 direction) of the electronic device 100 is omitted to easily understand an inside structure of the electronic device 100.

Figure 3:
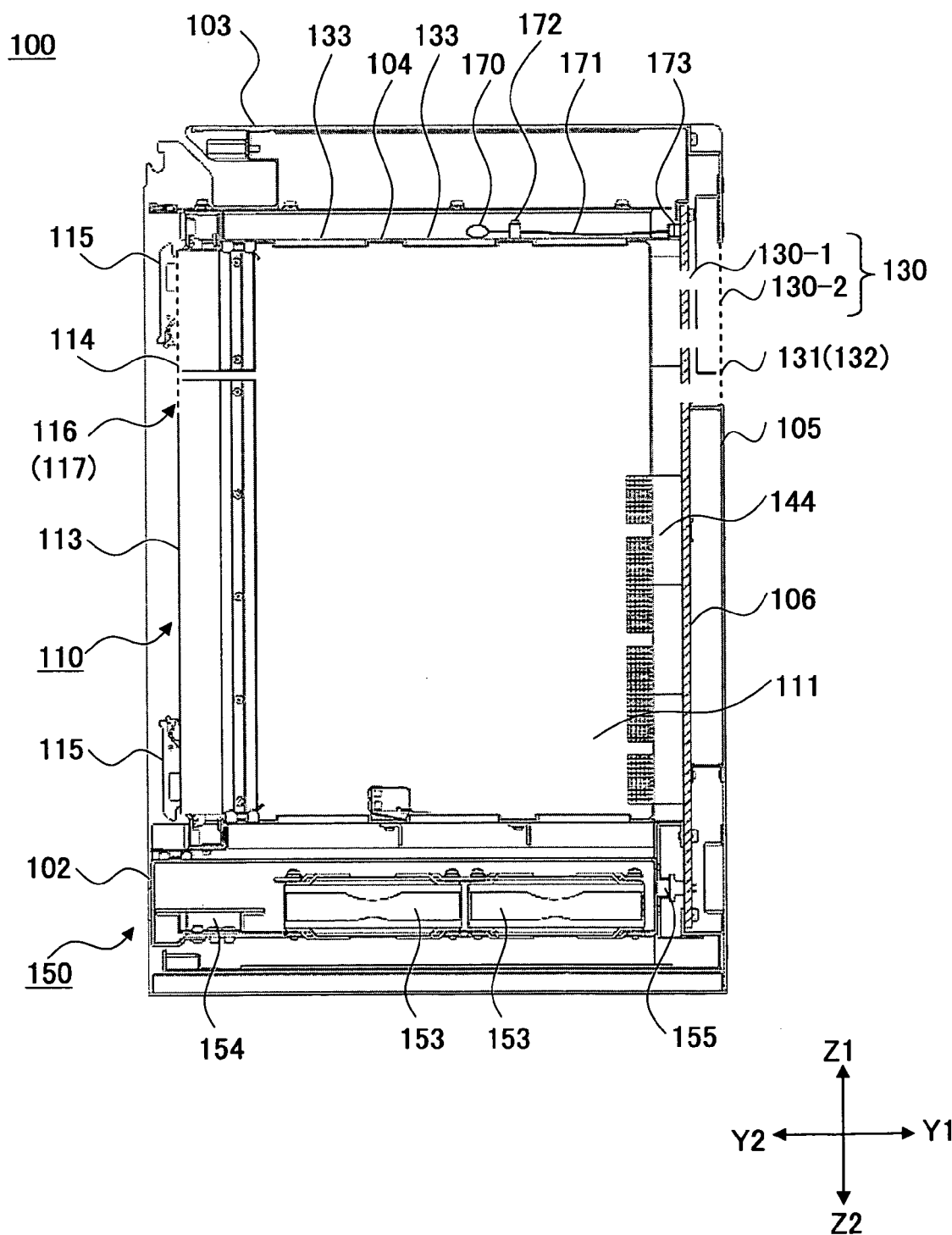
FIG. 3 is a cross-sectional view taken of the electronic device 100 shown in FIG. 1 taken along the line A—A in FIG. 2.
Figure 4:
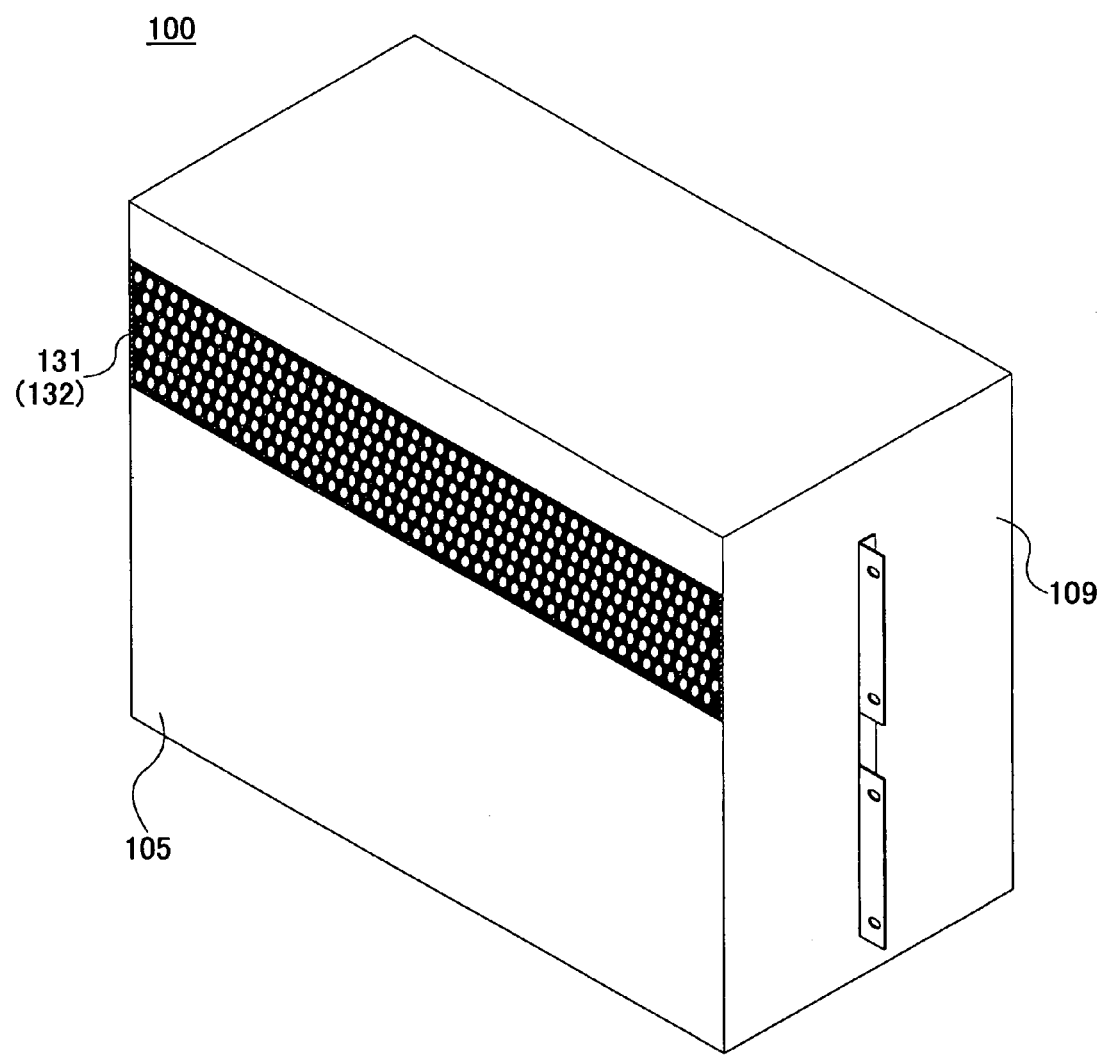
FIG. 4 is a perspective view of the electronic device 100 seen from a direction shown by an arrow B in FIG. 2.

FIG. 3 is a cross-sectional view of the electronic device 100 shown in FIG. 1 taken along the line A—A in FIG. 2. FIG. 4 is a perspective view of the electronic device 100 seen from a direction shown by an arrow B in FIG. 2.

Structures of the electronic devices 200 and 300 are same as the structure of the electronic device 100. Hence, explanation of the electronic device 100 represents explanations of the electronic devices 200 and 300.

Referring to FIG. 2, the electronic device 100 has a shelf 101 having a substantially box configuration. In the shelf 101, several plug-in units 110 which are objects to be cooled are installed in a horizontal width direction, namely X1–X2 direction, in parallel so as to form an electronic device main body part 180.

The plug-in unit 110 is inserted inside of the shelf 101 by sliding on a rail member (not shown) provided inside of the electronic device 100 and on a rail plate 104 whose upper surface is covered with the ceiling plate 103 provided on the upper surface (end surface in the Z1 direction) of the electronic device 100.

A fan unit installation part 102 is formed inside of the electronic device 100 and below the electronic device main body part 180. The fan unit 150 is installed in the fan unit installation part 102 so as to cool the inside of the electronic device 100. By inserting the fan unit 150 into the fan unit installation part 102, the fan unit 150 is installed inside of the electronic device 100 so that a fan installation part 190 is formed.

Referring to FIG. 3, a back surface cover member 105 is provided on a back surface of the electronic device 100, namely an end surface of the electronic device 100 in the Y1 direction. A back wiring board (hereinafter "BWB") 106 is provided in a height direction, namely Z1–Z2 direction of the electronic device 100, at a position slightly separated from the back surface cover member 105 in the Y2 direction.

The plug-in unit 110 has a printed wiring board 111 where electronic parts not shown in FIG. 3 are mounted. A surface plate 113 is provided at an end part in the Y2 direction of the printed wiring board 111. A lever 115 is rotatably provided at each of end parts of a upper side, namely in the Z1 direction and a lower side in the Z2 direction, of the surface plate 113.

A plug-in unit connector part 144 is provided at an end part in the Y1 direction of the printed wiring board 111. When the plug-in unit 110 is slid so that the plug-in unit 110 is completely inserted inside of the electronic device 100, the plug-in unit connector part 144 is engaged with a connector (not shown in FIG. 3) of the BWB 106 of the electronic device 100 so that a plug-in connection is made and thereby a connection for an electric signal is provided.

Furthermore, the plug-in unit 110 is fixed to the electronic device 100 by rotating the levers 115 provided the end parts of the upper side, namely in the Z1 direction and the lower side in the Z2 direction, of the surface plate 113.

A first air intake and exhaust hole forming area 116 is formed in a part that is the upper one third of the whole area of the surface plate 113. A punching metal part 117 where a designated number of first intake and exhaust hole forming parts 114 having designated diameters and areas are formed is installed in the first air intake and exhaust hole forming area 116. By the first intake and exhaust hole forming parts 114, air outside of the electronic device 100 is taken into an inside of the electronic device 100 or air inside of the electronic device 100 is exhausted to the outside of the electronic device 100.

A back board air intake and exhaust hole forming part 130-1 is formed in an area corresponding to the first air intake and exhaust hole forming area 116 at an upper part of the BWB 106. Furthermore, a second air intake and exhaust hole forming area 131 is formed in an area corresponding to the first air intake and exhaust hole forming area 116 at the back surface cover member 105. More specifically, a punching metal part 132 where a designated number of back surface cover air intake and exhaust hole forming parts 130-2 are formed is installed in the second air intake and exhaust hole forming area 131. See FIG. 4, too.

The back board air intake and exhaust hole forming part 130-1 and the back surface cover air intake and exhaust hole forming part 130-2 form a second air intake and exhaust hole forming part 130. By the second intake and exhaust hole forming parts 130, air outside of the electronic device 100 is taken into an inside of the electronic device 100 or air inside of the electronic device 100 is exhausted to the outside of the electronic device 100.

While the electronic device 100 is partially opened to the outside by the above-mentioned first air intake and exhaust hole forming part 114 and second air intake and exhaust hole forming part 130, the leakage of electromagnetic waves to the outside of the electronic device 100 is prevented due to shielding by the above-mentioned punching metal part 117 and the punching metal part 132. That is, the punching metal part 117 and the punching metal part 132 function as electromagnetic wave shielding members.

As described above, the punching metal part 132 installed at the back surface cover 105 situated more outside than the BWB 106 works as means for shielding the electromagnetic wave from leaking to the outside of the electronic device 100 at a side of a back surface of the electronic device 100, namely at the side of the Y1 direction. Hence, it is not necessary to provide such means at the BEB 106.

Thus, in this embodiment, the first intake and exhaust hole forming part 114 is installed at the front surface side of the electronic device 100, namely Y2 side in FIG. 2, and the second intake and exhaust hole forming parts 130 is installed at the back surface side of the electronic device 100, namely Y1 side in FIG. 2. However, the present invention is not limited to the above-mentioned structure. For example, the first intake and exhaust hole forming part 114 may be installed in a side surface 108 (See FIG. 2) situated at the X1 side in FIG. 2 of the electronic device 100, and the second intake and exhaust hole forming part 130 may be installed in a side surface 109 (See FIG. 4) situated at the X2 side in FIG. 2 of the electronic device 100.

The above mentioned first air intake and exhaust hole forming area 116 and second air intake and exhaust hole forming area 131 work as air intake and exhaust hole forming areas. The first intake and exhaust hole forming part 114 and second intake and exhaust hole forming part 130 work as air intake and exhaust hole forming parts.

Next, the structure of a rail plate 104 is discussed.

Figure 5:
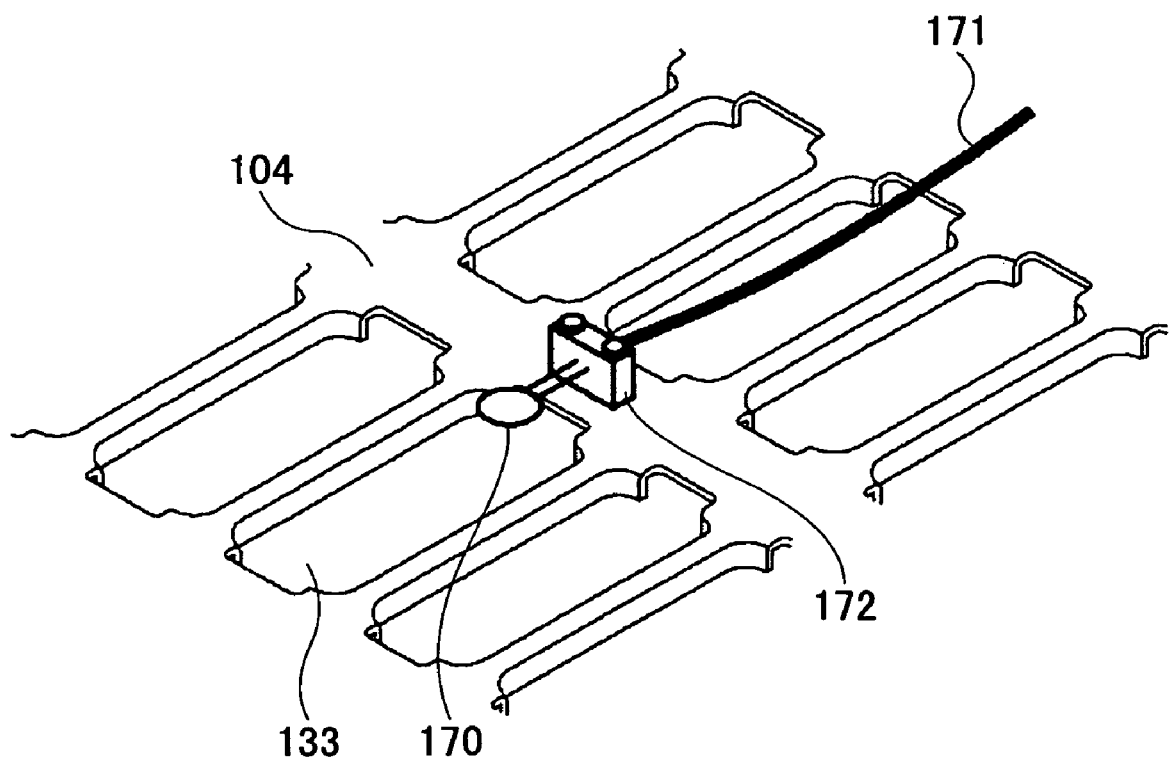
FIG. 5 is an enlarged view of a part surrounded by a dotted line C of a rail plate 104 shown in FIG. 2.

FIG. 5 is an enlarged view of a part surrounded by a dotted line C of a rail plate 104 shown in FIG. 2.

Referring to FIG. 3 and FIG. 5, a large number of rail plate hole forming parts 133 are arranged in the rail plate 104. By driving a fan unit 150 described later, air in the electronic device 100 is blown to an electronic device 200 (See FIG. 1) provided above the electronic device 100 via the rail plate hole forming parts 133, the air exhaust hole forming part 16 (See FIG. 1), and the air intake hole forming part 25 (See FIG. 1) of the electronic device 200.

A designated number of sockets 172 for installing sensors, described later, are screw-fixed at designated parts of the rail plate 104 where the above-mentioned rail plate hole forming parts 133 are not formed.

A sensor is connected to the socket 172. The sensor 170 faces the rail plate hole forming part 133 which is a part where the air inside of the electronic device 100 passes.

The sensor 170 is a thermistor, for example, and works as a temperature sensor. In this embodiment, the sensor 170 measures air temperature inside of the electronic device 100. An optional number of the sensors 170 are provided at measuring parts which are determined in advance by a temperature simulation or the like.

A cable 171 for sensing is also connected to the socket 172. A connector 173 (See FIG. 3) is provided at an end part at a side not connected to the socket 172 of the cable 171. The connector 173 is connected to the BWB 106 (See FIG. 3). Under this structure, the sensor is electrically connected to the BWB 106.

Next, the structure of a fan unit 150 is discussed.

Figure 6:
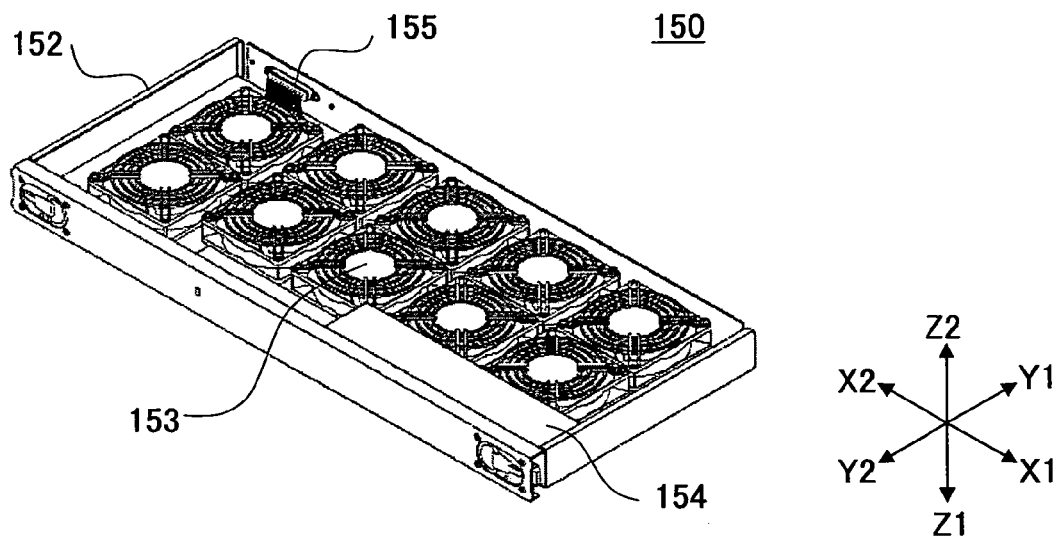
FIG. 6 is a perspective view showing an inside structure of a fan unit 150 shown in FIG. 2.

FIG. 6 is a perspective view showing an inside structure of the fan unit 150 shown in FIG. 2. In FIG. 6, a cover member 151 (See FIG. 2) covering a part of an upper side of the fan unit 150 is removed.

Referring to FIG. 6, the fan unit 150 has a frame body 152 whose plane rectangular-shaped configuration is substantially the same as the plane configuration of the shelf 101 (See FIG. 2).

Plural fans 153, ten fans 153 as shown in FIG. 6 for example, are arranged in a level plane in the frame body 152. For example, a direct current (DC) drive axial fan or the like can be used as the fan 153. The fan 153 works as an air ventilation part. By driving the fan 153, air inside of the electronic device 100 is blown up from a lower part to an upper part, namely in the Z1 direction in FIG. 2, so that the inside of the electronic device 100 is cooled.

A fan control part 154 is provided at an inside of the frame body 152 and a front surface side, namely the Y2 direction side. The fan control part 154 has a printed circuit board (not shown in FIG. 6) for a fan control circuit for controlling the number of rotations of the fans 153.

A fan unit connector 155 is provided at the back surface side, namely the Y1 direction side, of the frame body 152 so as to be connected to the BWB 106 (See FIG. 3). The fans 153, the fan control part 154 and the fan unit connector 155 are connected to each other by a cable (not shown in FIG. 6). Therefore, the fans 153 and the fan control part 154 are electrically connected to the BWN 106 (See FIG. 3) via the fan unit connector 155.

Meanwhile, as discussed with reference to FIG. 3, the sensor 170 provided at the upper part of the electronic device 100 is electrically connected to the BWB 106 via the cable 171.

Therefore, the temperature of the inside of the electronic device 100 sensed by the sensor 170 is transmitted to the BWB 106 via the cable 171 as a voltage change and then transmitted to the fan unit connector 155 provided in the fan unit 150 via a circuit pattern formed in the BWB 106. Based on the transmitted information, the fan control part 154 of the fan unit 150 controls the number of rotations of the fans 153 and works as an air ventilation part controlling part.

Figure 7:
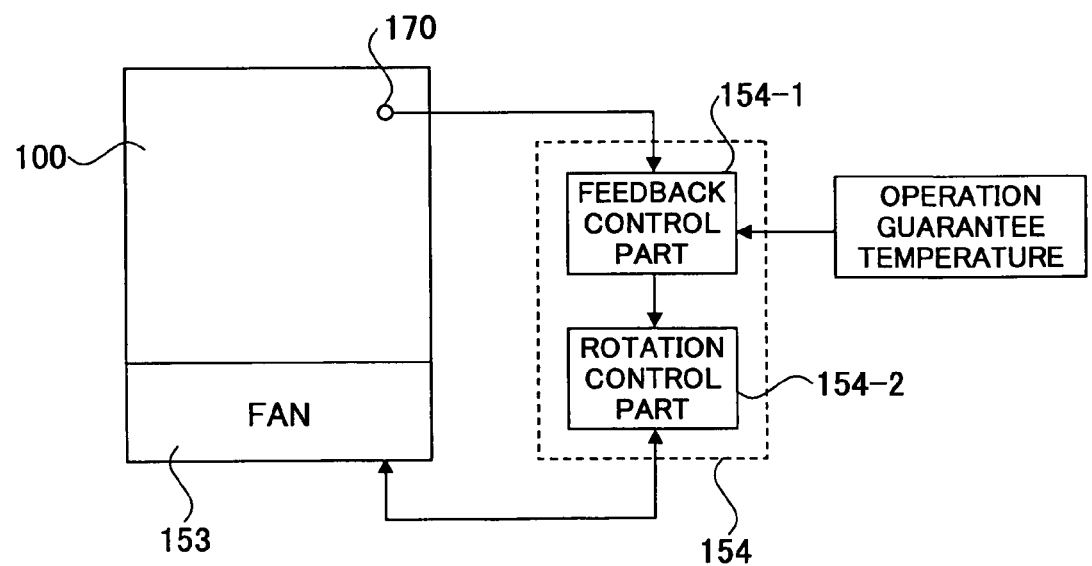
FIG. 7 is a schematic view showing a method for controlling the number of rotation of a fan 153 by a fan control part 154.

FIG. 7 is a schematic view showing a method for controlling the number of rotations of the fans 153 by the fan control part 154. For convenience of explanation, the fan control part 154 is shown taken out from the electronic device 100 in FIG. 7.

Referring to FIG. 7, the fan control part 154 includes a feedback control part 154-1 and a rotation control part 154-2.

As described above, temperature of the inside of the electronic device 100, sensed by the sensor 170, is transmitted to the fan control part 154. The feedback control part 154-1 of the fan control part 154 compares the temperature of the inside of the electronic device 100, sensed by the sensor 170, and an operation guarantee temperature which is set in advance as a temperature at which it is guaranteed that the electronic device 100 properly operates.

The feedback control part 154-1 further outputs a control signal in proportion to a temperature difference of the above-mentioned temperatures to the rotation control part 154-2, so that the temperature of the inside of the electronic device 100 becomes equal to the operation guarantee temperature.

The rotation control part 154-2 controls the number of rotations of the fans 153 based on an output signal of the feedback control part 154-1 so that the temperature of the inside of the electronic device 100 is maintained constant at the operation guarantee temperature. More specifically, when the temperature of the inside of the electronic device 100 is higher than the operation guarantee temperature, the rotation control part 154-2 increases the number of the rotations of the fans 153 so that the number of the rotations of the fans 153 becomes high. When the temperature of the inside of the electronic device 100 is lower than the operation guarantee temperature, the rotation control part 154-2 decreases the number of the rotations of the fans 153 so that the number of the rotations of the fans 153 becomes low.

Meanwhile, as discussed with reference to FIG. 2, FIG. 3, and FIG. 5, in this embodiment, the sensor 170 provided at the upper parts of the electronic devices 100, 200, and 300 senses a temperature of inside air atmosphere of the electronic devices 100, 200, and 300.

Figure 9:
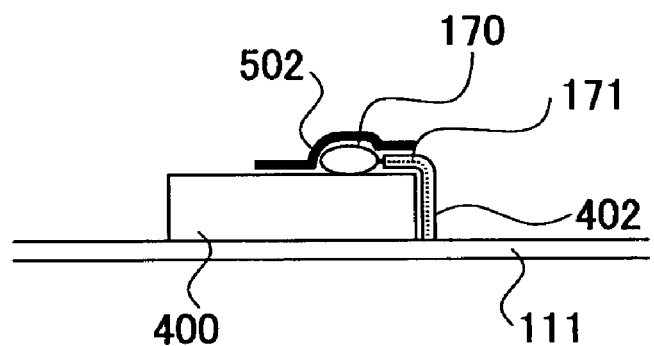
FIG. 9 is a view showing a second example wherein a sensor 170 is arranged at an electronic part 400 mounted on a printed wiring board 111.
Figure 10:
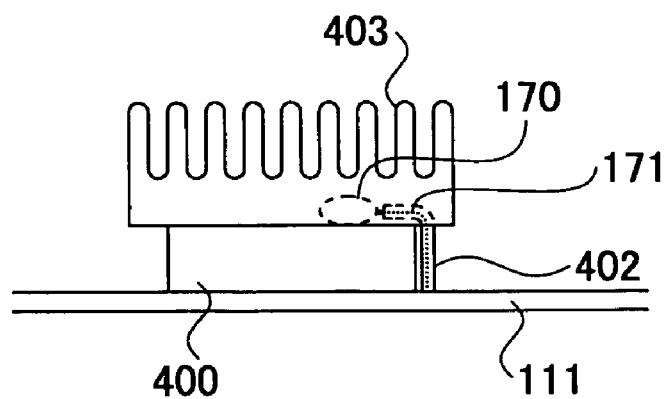
FIG. 10 is a view showing a third example wherein a sensor 170 is arranged at an electronic part 400 mounted on a printed wiring board 111.

However, the present invention is not limited to the above-mentioned structure. For example, as shown in FIG. 8, FIG. 9, and FIG. 10, the sensor 170 may be attached to an electronic parts mounted on the printed wiring board 111 of the plug-in unit 110 shown in FIG. 2 and FIG. 3.

Figure 8:
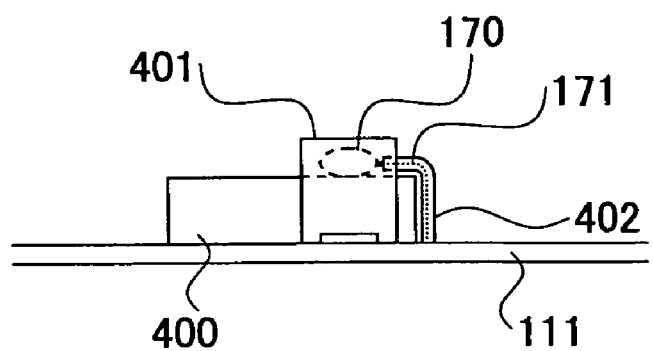
FIG. 8 is a view showing a first example wherein a sensor 170 is arranged at an electronic part 400 mounted on a printed wiring board 111.

FIG. 8 is a view showing a first example wherein the sensor 170 is arranged at an electronic part 400 mounted on the printed wiring board 111.

Referring to FIG. 8, the sensor 170 is mounted on the electronic part 400. The sensor 170 and the electronic part 400 are covered with a pushing metal fitting member 401 so that the sensor 170 is pushed and fixed on the electronic part 400.

Furthermore, the cable 170 for the sensor 170 which is connected to the sensor 171 is covered with a tube member 402. An end, where the sensor 170 is not connected, of the cable 171 covered with the tube member 402 is taken in the wiring pattern (not shown) of the printed wiring board 111.

FIG. 9 is a view showing a second example wherein the sensor 170 is arranged at the electronic part 400 mounted on the printed wiring board 111.

Referring to FIG. 9, the sensor 170 is mounted on the electronic part 400 and fixed on the electronic part 400 by a tape 502. The tape 502 has a high insulating property against temperature change.

As well as the case shown in FIG. 8, the cable 171 for the sensor 170 which is connected to the sensor 170 is covered with the tube member 402. An end, where the sensor 170 is not connected, of the cable 171 covered with the tube member 402 is taken in the wiring pattern (not shown) of the printed wiring board 111.

FIG. 10 is a view showing a third example wherein the sensor 170 is arranged at the electronic part 400 mounted on the printed wiring board 111.

Referring to FIG. 10, the sensor is mounted on the electronic part 400. A fin 403 is provided on the electronic part 400 and the sensor 170 so that the sensor 170 is put between the electronic part 400 and the fin 403.

Furthermore, as well as the cases shown in FIG. 8 and FIG. 9, the cable 171 connected to the sensor 179 is covered with the tube member 402. An end, where the sensor 170 is not connected, of the cable 171 covered with the tube member 402 is taken in the wiring pattern (not shown) of the printed wiring board 111.

Under structures shown in FIG. 8 through FIG. 10, by plugging in the plug-in unit 110 shown in FIG. 3 to the BWB 106, the temperature of the electronic part 400 sensed by the sensor 170 is transmitted to the BWB 106 as a voltage change, and then transmitted to the fan unit connector 155 provided in the fan unit 150 via the circuit pattern formed in the BWB 106. Based on the transmitted information, the fan control part 154 of the fan unit 150 controls the number of rotations of the fans 153. See FIG. 3.

According to the structures shown in FIG. 8 through FIG. 10, even if an allowable temperature of the electronic part 400 mounted on the printed wiring board 111 of the plug-in unit 110 is low, it is possible to securely sense the temperature of the electronic part 400 and control the number of the rotations of the fans 153 so that the temperature of the electronic part 400 is prevented from being higher than the operation guarantee temperature. Because of this, it is possible to protect the electronic part 400 mounted on the printed wiring board 111 of the plug-in unit 110.

The sensor 170 may be provided at a part corresponding to a measurement point set in advance in the plug-in unit 110 based on a result of a temperature simulation, for example.

Next, a method for cooling the communication equipment 1 of the present invention having the electronic devices 100, 200, and 300 having the above-mentioned structures is discussed.

Figure 11:
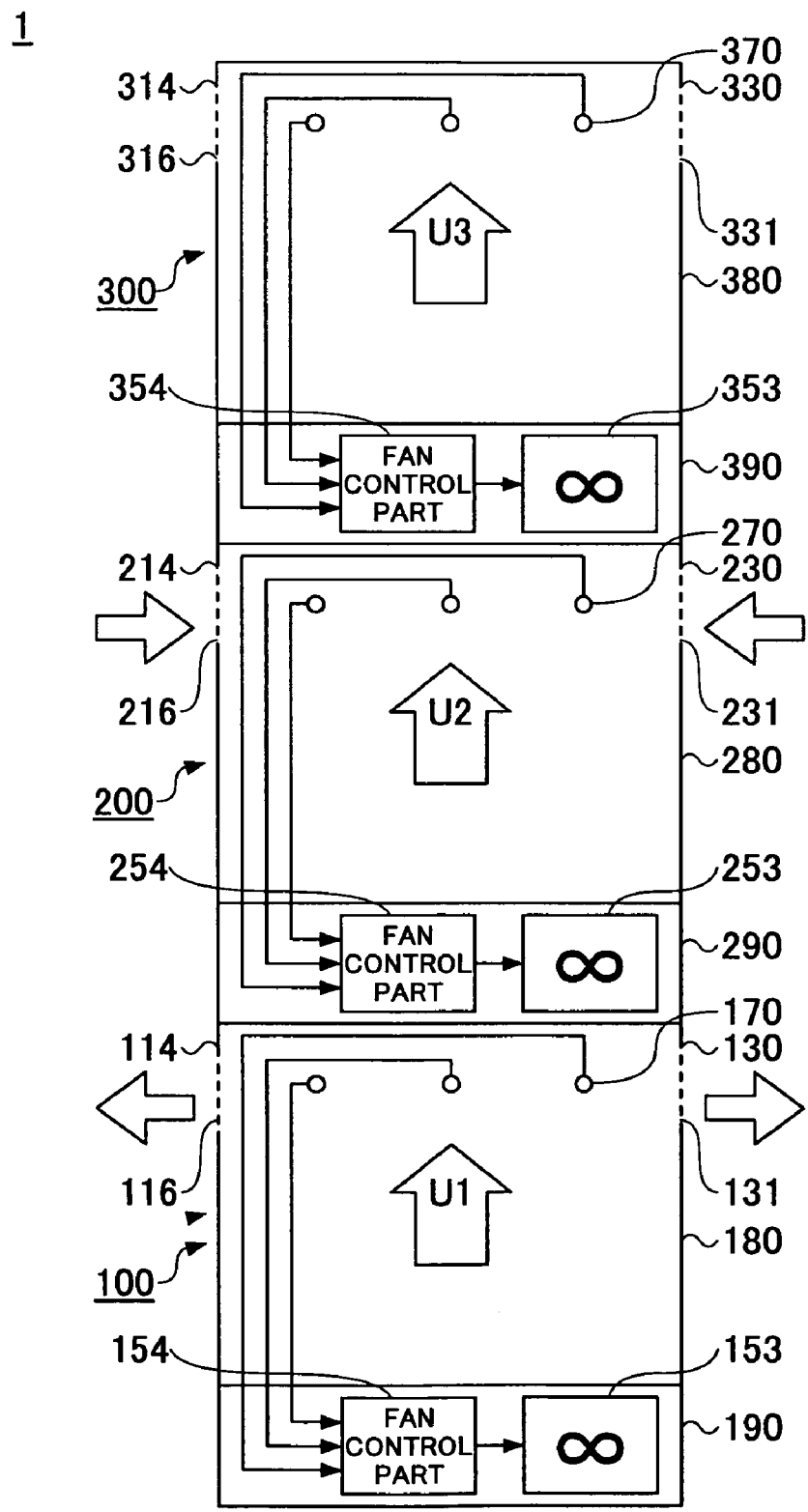
FIG. 11 is a schematic view of the communication equipment 1 for explaining air flow in the electronic devices 100, 200 and 300.

FIG. 11 is a schematic view of the communication equipment 1 for explaining an air flow in the electronic devices 100, 200 and 300.

As described above, the electronic device 100 includes an electronic device main part 180 and a fan installation part 190 provided below the electronic device main part 180. The sensor 170 for sensing a temperature inside of the electronic device 100 is provided inside of the electronic device main part 180. The fan control part 154 of the fan installation part 190 controls the number of rotations of the fans 153 so that the temperature inside of the electronic device 100 which is sensed by the sensor 170 becomes a constant operation guarantee temperature.

Furthermore, at the upper part of the electronic device main part 180, the first intake and exhaust hole forming part 114 and second intake and exhaust hole forming part 130 are provided in the first air intake and exhaust hole forming area 116 and second air intake and exhaust hole forming area 131 so that the air outside of the electronic device 100 can be taken inside of the electronic device 100 or air inside of the electronic device 100 can be exhausted outside of the electronic device 100.

Furthermore, as described above, the electronic device 200 also has the same structure as the electronic device 100. That is, as shown in FIG. 11, the electronic device 200 includes an electronic device main part 280, a fan installation part 290, a fan control part 254, a fan 253, a sensor 270, a first air intake and exhaust hole forming part 214, a second air intake and exhaust hole forming part 230, a first air intake and exhaust hole forming area 216, and a second air intake and exhaust hole forming area 231.

Similarly, the electronic device 300 also has the same structure as the electronic device 100. That is, as shown in FIG. 11, the electronic device 300 includes an electronic device main part 380, a fan installation part 390, a fan control part 354, a fan 353, a sensor 370, a first air intake and exhaust hole forming part 314, a second air intake and exhaust hole forming part 330, a first air intake and exhaust hole forming area 316, and a second air intake and exhaust hole forming area 331.

That is, in this embodiment, the electronic devices 100, 200 and 300 are superposed on each other in the height direction of the communication equipment 1. The fan installation part 290 provided at the lower part of the electronic device 200 provided on the electronic device 100 and the first air intake and exhaust forming part 114 and the second air intake and exhaust forming part 130 provided at the upper part of the electronic device 100 are adjacently positioned.

Similarly, the fan installation part 390 provided at the lower part of the electronic device 300 provided on the electronic device 200 and the first air intake and exhaust forming part 214 and the second air intake and exhaust forming part 230 provided at the upper part of the electronic device 200 are adjacently positioned.

Under this structure, the communication equipment 1 of the present invention is cooled according to the following equation 1 showing an air flow of air which flows inside of the electronic devices 100, 200 and 300.

$$V1 = V2 + V3 \qquad \text{[Equation 1]}$$

Here, V1 represents the air flow of air propelled from a fan from an electronic device (1). V2 represents an air flow set from another electronic device (2) provided below the electronic device (1) to a fan of the electronic device (1). V3 represents an air flow which is taken in or exhausted from the first and second air intake and exhaust hole forming parts of the electronic device (2) provided below the electronic device (1). A case of "intake" is expressed as a positive, and a case of "exhaust" is expressed as a negative.

For example, it is hypothetically assumed that the temperature inside of the electronic device 100 and the temperature inside of the electronic device 300 are higher than the operation guarantee temperature, and the temperature inside of the electronic device 200 is lower than the operation guarantee temperature.

In this case, in the electronic device 100 whose inside has a temperature higher than the operation guarantee temperature, the fan control part 154 makes the fan 153 rotate at a high speed based on a sensing result of the sensor 170 in order to make the inside temperature of the electronic device 100 become equal to the operation guarantee temperature.

On the other hand, in the electronic device 200 whose inside has a temperature lower than the operation guarantee temperature, the fan control part 254 makes the fan 253 rotate at a low speed based on a sensing result of the sensor 270.

Therefore, an air flow U1 generated inside of the electronic device 100 by the rotation of the fan 153 and sent to the electronic device 200 is larger than an air flow U2 generated inside of the electronic device 200 by the rotation of the fan 253.

The first air intake and exhaust hole forming part 114 and the second air intake and exhaust hole forming part 130 are provided in the vicinity of a lower side of the fan installation part 290 of the electronic device 200 provided on the electronic device 100. Hence, air having a high temperature inside of the electronic device 100 is exhausted from the first air intake and exhaust hole forming part 114 and the second air intake and exhaust hole forming part 130 and the above-mentioned equation 1 is satisfied.

Thus, it is possible to control air flowing in the electronic device 200 so that waste of electric power due to rotation of the fan 253 in vain can be prevented.

In the electronic device 200 whose inside has a temperature lower than the operation guarantee temperature, the fan control part 254 makes the fan 253 rotate at a low speed based on a sensing result of the sensor 270.

In the electronic device 300 whose inside has a temperature higher than the operation guarantee temperature, the fan control part 354 makes the fan 353 rotate at a high speed based on a sensing result of the sensor 370 in order to make the inside temperature of the electronic device 300 equal to the operation guarantee temperature.

Therefore, the air flow U2 generated inside of the electronic device 200 by the rotation of the fan 253 and sent to the electronic device 300 is smaller than an air flow U3 generated inside of the electronic device 300 by the rotation of the fan 353.

The first air intake and exhaust hole forming part 214 and the second air intake and exhaust hole forming part 230 are provided in the vicinity of a lower side of the fan installation part 390 of the electronic device 300 provided on the electronic device 200.

Hence, air outside of the electronic device 200 which has a temperature lower than the inside of the electronic device 200 is taken in through the first air intake and exhaust hole forming part 214 and the second air intake and exhaust hole forming part 230.

The outside air taken in through the first air intake and exhaust hole forming part 214 and the second air intake and exhaust hole forming part 230 is mixed with the air having an air flow U2 generated inside of the electronic device 200 by the rotation of the fan 253 and sent to the electronic device 300 so as to be supplied to the electronic device 300 whose inside has a temperature higher than the operation guarantee temperature. As a result of this, the above-mentioned equation 1 is satisfied.

Thus, according to the method for cooling the communication equipment 1 of the present invention, in order to make the inside temperature of the electronic devices 100, 200 and 300 equal to the operation guarantee temperatures, the fans 153, 253 and 353 are rotated so that air having designated air flow is provided. Through the first air intake and exhaust hole forming parts 114, 214, and 314 and the second air intake and exhaust hole forming parts 130, 230 and 330, air outside of the electronic devices 100, 200 and 300 is taken inside of the electronic devices 100, 200 and 300, or air inside of the electronic devices 100, 200 and 300 is exhausted to outside of the electronic devices 100, 200 and 300. Because of this, air flows of the air ventilated (circulated) inside of the electronic devices 100, 200 and 300 are controlled.

Therefore, because of control of the air flow by the first air intake and exhaust hole forming parts 114, 214, and 314 and the second air intake and exhaust hole forming part 130, 230 and 330, when the fan control parts 154, 254 and 354 control the rotations of the fans 153, 253 and 353 in order to keep the temperature sensed by the sensors 170, 270 and 370 constant, rotating the fans 153, 253 and 353 more than necessary cab be prevented. Therefore, it is possible to reduce consumption of electric power for the fans 153, 253 and 353.

Meanwhile, inventors of the present invention did two kinds of simulations and obtained the following results, in order to know proper positions and areas of the first air intake and exhaust hole forming areas 116, 216, and 316 where the first air intake and exhaust hole forming parts 114, 214, and 314 are formed and the second air intake and exhaust hole forming areas 131, 231 and 331 where the second air intake and exhaust hole forming part 130, 230 and 330 are formed; and proper numerical apertures of the first air intake and exhaust hole forming parts 114, 214, and 314 in the first air intake and exhaust hole forming areas 116, 216, and 316 and the second air intake and exhaust hole forming part 130, 230 and 330 in the second air intake and exhaust hole forming areas 131, 231 and 331.

Here, as conditions for the simulation, measurement of the electronic device main parts 180, 280 and 380 are set as having 235 mm as a vertical length, 541 mm as a horizontal length, and 118.5 mm as a height, and measurement of the fan installation parts 190, 290 and 390 are set as having 235 mm as a vertical length, 541 mm as a horizontal length, and 458.5 mm as a height.

Furthermore, numerical apertures of the air intake hole forming parts 15, 25 and 35 and the air exhaust hole forming parts 16, 26 and 36 are set as 40%, and loss factors of the air intake hole forming parts 15, 25 and 35 and the air exhaust hole forming parts 16, 26 and 36 are set as 3.0.

In addition, the consumption of electric power by heating elements inside of the electronic devices 100, 200 and 300, and the rotations of the fans 153, 253 and 353 are set as shown in the following table 1.

TABLE 1

|  | Electronic Device 100 | Electronic Device 200 | Electronic Device 300 |
|---|---|---|---|
| Consumption of Electric Power By Heating Elements In Electronic Device [W] | 34.5 × 20 | 17.25 × 20 | 34.5 × 20 |
| Rotation of Fan | High Speed Rotation | Low Speed Rotation | High Speed Rotation |

Figure 12:
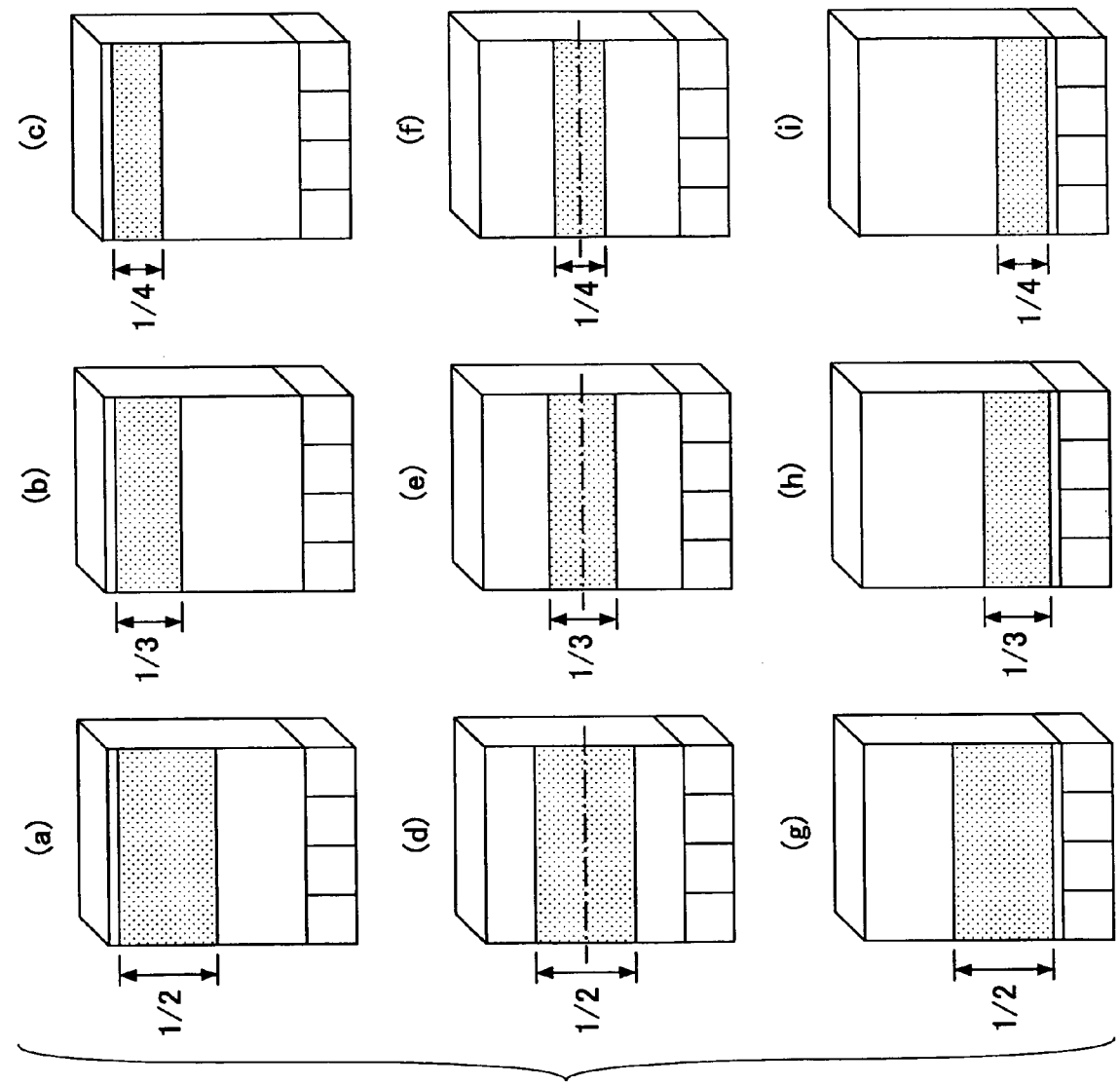
FIG. 12 is a view showing nine conditions with regard to positions and areas of first intake and exhaust hole forming areas 116, 216 and 316 and second intake and exhaust hole forming areas 131, 231 and 331 in a first simulation.

The inventors of the present invention did a first simulation, by setting constant 40% as the numerical apertures of the first air intake and exhaust hole forming parts 114, 214, and 314 in the first air intake and exhaust hole forming areas 116, 216, and 316 and the second air intake and exhaust hole forming part 130, 230 and 330 in the second air intake and exhaust hole forming areas 131, 231 and 331, and changing positions and areas of the first air intake and exhaust hole forming areas 116, 216, and 316 where the first air intake and exhaust hole forming parts 114, 214, and 314 are formed and the second air intake and exhaust hole forming areas 131, 231 and 331 where the second air intake and exhaust hole forming part 130, 230 and 330 are formed as shown in FIG. 12.

FIG. 12 is a view showing nine conditions (FIG. 12-(*a*) through FIG. 12-(*i*)) with regard to the positions and areas of the first intake and exhaust hole forming areas 116, 216 and 316 and the second intake and exhaust hole forming areas 131, 231 and 331 in the first simulation.

In the condition shown in FIG. 12-(*a*), the first air intake and exhaust hole forming areas 116, 216, and 316 and the second air intake and exhaust hole forming areas 131, 231 and 331 are formed in an area occupying the upper half of the front surface and back surface of the electronic device main parts 180, 280 and 380.

In the condition shown in FIG. 12-(*b*), the first air intake and exhaust hole forming areas 116, 216, and 316 and the second air intake and exhaust hole forming areas 131, 231 and 331 are formed in an area occupying the upper one third of the front surface and back surface of the electronic device main parts 180, 280 and 380.

In the condition shown in FIG. 12-(*c*), the first air intake and exhaust hole forming areas 116, 216, and 316 and the second air intake and exhaust hole forming areas 131, 231 and 331 are formed in an area occupying the upper one fourth of the front surface and back surface of the electronic device main parts 180, 280 and 380.

In the condition shown in FIG. 12-(*d*), the first air intake and exhaust hole forming areas 116, 216, and 316 and the second air intake and exhaust hole forming areas 131, 231 and 331 are formed in an area occupying the middle half of the front surface and back surface of the electronic device main parts 180, 280 and 380 line-symmetrically with respect to a center part of the electronic device main parts 180, 280 and 380 (shown by one point dotted line).

In the condition shown in FIG. 12-(*e*), the first air intake and exhaust hole forming areas 116, 216, and 316 and the second air intake and exhaust hole forming areas 131, 231 and 331 are formed in an area occupying the middle one third of the front surface and back surface of the electronic device main parts 180, 280 and 380 line-symmetrically with respect to a center part of the electronic device main parts 180, 280 and 380 (shown by one point dotted line).

In the condition shown in FIG. 12-(*f*), the first air intake and exhaust hole forming areas 116, 216, and 316 and the second air intake and exhaust hole forming areas 131, 231 and 331 are formed in an area occupying the middle one fourth of the front surface and back surface of the electronic device main parts 180, 280 and 380 line-symmetrically with respect to a center part of the electronic device main parts 180, 280 and 380 (shown by one point dotted line).

In the condition shown in FIG. 12-(*g*), the first air intake and exhaust hole forming areas 116, 216, and 316 and the second air intake and exhaust hole forming areas 131, 231 and 331 are formed in an area occupying the lower half of the front surface and back surface of the electronic device main parts 180, 280 and 380.

In the condition shown in FIG. 12-(*h*), the first air intake and exhaust hole forming areas 116, 216, and 316 and the second air intake and exhaust hole forming areas 131, 231 and 331 are formed in an area occupying the lower one third of the front surface and back surface of the electronic device main parts 180, 280 and 380.

In the condition shown in FIG. 12-(*i*), the first air intake and exhaust hole forming areas 116, 216, and 316 and the second air intake and exhaust hole forming areas 131, 231 and 331 are formed in an area occupying the lower one fourth of the front surface and back surface of the electronic device main parts 180, 280 and 380.

Under the above-discussed conditions, the simulation was done and it is found that the temperature rises at upper parts, center parts, and lower parts of the electronic devices. FIG. 13 shows a table showing the results of the first simulation under the conditions shown in FIG. 12.

Referring to FIG. 13, under the conditions shown in FIG. 12-(*b*) or FIG. 12-(*c*), namely in the case where the first air intake and exhaust hole forming areas 116, 216, and 316 and the second air intake and exhaust hole forming areas 131, 231 and 331 are formed in an area occupying the upper one third through one fourth of the front surface and back surface of the electronic device main parts 180, 280 and 380, temperature increases of the electronic devices 100, 200 and 300 are least and therefore the best cooling effect of the electronic devices 100, 200 and 300 is obtained.

Under the conditions shown in FIG. 12-(*g*) through FIG. 12-(*i*), that is in the case where the first air intake and exhaust hole forming areas 116, 216, and 316 and the second air intake and exhaust hole forming areas 131, 231 and 331 are formed at a lower side of the front and back surfaces, namely a side close to the fans 153, 253 and 353, since directivity of a current of air propelled from the fans 153, 253 and 353 is strong, the propelled air spreads to the outside in the vicinity of the fans 153, 253 and 353. Therefore, air propelled from the fans 153, 253 and 353 and having a high speed is blown out to the outside of the electronic devices 100, 200 and 300 via the first air intake and exhaust hole forming parts 114, 214 and 314 and the second air intake and exhaust hole forming parts 130, 230 and 330 and therefore the cooling effect is degraded.

Next, the inventors did a second simulation, by setting the first air intake and exhaust hole forming areas 116, 216, and 316 and the second air intake and exhaust hole forming areas 131, 231 and 331 to be formed in an area occupying the upper one third of the front surface and back surface of the electronic device main parts 180, 280 and 380, as shown in FIG. 12-(*b*), and changing the numerical apertures of the first air intake and exhaust hole forming parts 114, 214, and 314 in the first air intake and exhaust hole forming areas 116, 216, and 316 and the second air intake and exhaust hole forming part 130, 230 and 330 in the second air intake and exhaust hole forming areas 131, 231 and 331 to 0%, 10%, 20%, 30% and 40%.

Figures 14, 15:
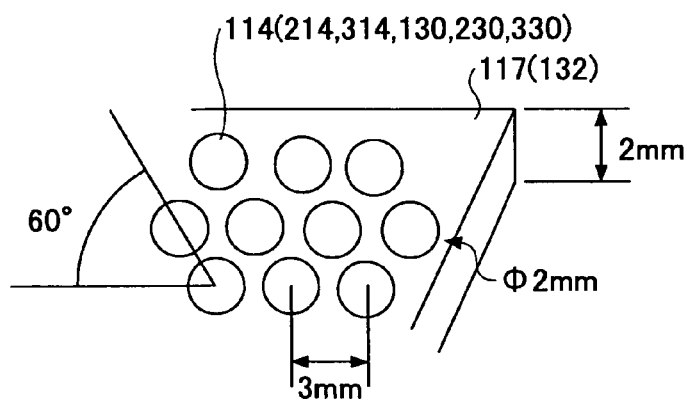
FIG. 14 is a table showing results of a second simulation.
FIG. 15 is a perspective view showing a part of punching metal part 117.

As a result of the second simulation, temperature increases at the upper part, center part and lower part of the electric device main parts 180, 280 and 380 as shown in FIG. 14 are found. Here, FIG. 14 shows a table showing the result of the second simulation.

Referring to FIG. 14, under the conditions that the numerical apertures of the first air intake and exhaust hole forming parts 114, 214, and 314 in the first air intake and exhaust hole forming areas 116, 216, and 316 and the second air intake and exhaust hole forming part 130, 230 and 330 in the second air intake and exhaust hole forming areas 131, 231 and 331 are 20% through 40%, temperature increases of the electronic devices 100, 200 and 300 are least and therefore best cooling effect on the electronic devices 100, 200 and 300 is obtained. That is to say, if only minimizing the temperature increases inside of the electronic device main parts 180, 280 and 380 is considered, it is preferable that the above-mentioned numerical aperture be made large.

However, it the numerical aperture is too large, shielding against leakage of the electromagnetic waves of the electronic devices 100, 200 and 300 is made weak.

The inventors of the present invention realized that it is possible to make the temperature increases inside of the electronic device main parts 180, 280 and 380 the least and effectively shield against leakage of the electromagnetic wave to the outside of the electronic devices 100, 200 and 300, by applying the structure shown in FIG. 15 to the punching metal parts 117 and 132 shown in FIG. 3 and others. Here, FIG. 15 is a perspective view showing a part of the punching metal parts 117 and 132.

Referring to FIG. 15, in the punching metal parts 117 and 132 each of which has a plate having a thickness of 2 mm, plural opening circles having diameters of 2 mm are formed in a state where center parts of the circles are offset to the side at 3 mm and 60 degrees.

Under this structure, in a case where the numerical aperture is 40.3%, that is, the opening parts are formed in the punching plate in a state where 115 opening circles are formed per a square having a side of a wave length, 30.2 dB of shielding effect for electromagnetic waves having a frequency of 10 GHz is obtained by the following equation 2.

Shielding effect for electromagnetic waves having a frequency of 10 GHz=20 $\log(f_c/f)$+27.3$(t/w)$−10 $\log(n)$ [Equation 2]

Here, "w" represents the diameter of the opening circle and is 2 mm in the example shown in FIG. 12; "t" represents the thickness of the punching metal and is 2 mm in the example shown in FIG. 12; "f" represents the frequency and is 10 GHz in the example shown in FIG. 12; "$f_c$" represents a shield frequency and is $1.76 \times 10^{11}/W$=87.7 GHz in the example shown in FIG. 12; and "n" represents the number of opening circles formed per a square having a side of a wave length λ ($3 \times 10^8/f$=30 mm) and is 115 in the example shown in FIG. 12.

Thus, in order to realize that it is possible to make the temperature increases inside of the electronic device main parts 180, 280 and 380 the least and effectively shield against leakage of the electromagnetic waves to the outside of the electronic devices 100, 200 and 300, it is most preferable that the numerical aperture in the punching metal parts 117 and 132 be approximately 40%, for example.

Thus, under the conditions shown in FIG. 12-(*b*) or FIG. 12-(*c*), namely in the case where the first air intake and exhaust hole forming areas 116, 216, and 316 and the second air intake and exhaust hole forming areas 131, 231 and 331 are formed in an area occupying the upper one third through one fourth of the front surface and back surface of the electronic device main parts 180, 280 and 380, and the numerical apertures of the first air intake and exhaust hole forming parts 114, 214, and 314 in the first air intake and exhaust hole forming areas 116, 216, and 316 and the second air intake and exhaust hole forming part 130, 230 and 330 in the second air intake and exhaust hole forming areas 131, 231 and 331 are 20% through 40%, it is possible to effectively shield against the leakage of the electromagnetic waves to outside of the electronic devices 100, 200 and 300 and make the temperature increases of the electronic devices 100, 200 and 300 the least and therefore the best cooling effect for the electronic devices 100, 200 and 300 is obtained.

Therefore, under the above-discussed structure, in a case where the plug-in units 110 which are heating sources, are not installed fully inside of the electronic devices 100, 200 and 300, it is possible to reduce the number of rotations of the fans cooling the inside of the electronic devices 100, 200 and 300 so that consumption of electric power of the fans can be efficiently reduced.

For example, in a case where the plug-in units 110 which are heating sources are fully installed inside of the electronic devices 100, 200 and 300 and the fans 153, 253 and 353 which consume electric power of 50W for cooling them are installed in the electric devices 100, 200 and 300 but only half of the plug-in units 110 actually work, electric power of 150 W is consumed for driving the fans 153, 253 and 353 in the conventional art. However, according to the present invention, only approximately 75 W is consumed and therefore it is possible to reduce consumption of the electric power.

The present invention is not limited to these embodiments, but variations and modifications may be made without departing from the scope of the present invention.

What is claimed is:

1. A cooling structure for electronic equipment including a plurality of electronic devices superposed on each other, each of the electronic devices having a lower part where an air ventilation part configured to ventilate air so as to coot the electronic device is provided, the cooling structure comprising:
   an air intake and exhaust hole forming part which is formed at an upper part of a first one of the electronic devices and below the air ventilation part of a second one of the electronic devices provided on the first electronic device;
   wherein air outside of the electronic equipment is taken into an inside of the second electronic device or air inside of the first electronic device is exhausted to the outside of the electronic equipment via the air intake and exhaust hole forming part, so that an amount of the air ventilated inside of the first electronic device is controlled.

2. The cooling structure as claimed in claim 1,
   wherein the electronic device includes an electronic device main part situated above the air ventilation part,
   a cooling object of the air ventilation part is provided at the electronic device main part,
   an air intake and exhaust hole forming area is formed in an area occupying an upper one third through one fourth of front and back surfaces of the electronic device main part, and
   the air intake and exhaust hole forming part is formed in the air intake and exhaust hole forming area.

3. The cooling structure as claimed in claim 2,
   wherein a numerical aperture of the air intake and exhaust hole forming part in the air intake and exhaust hole forming area is 20% through 40%.

4. The cooling structure as claimed in claim 2,
   wherein an electromagnetic wave shielding member, configured to shield against the leakage of an electromagnetic wave to the outside of the electronic device, is provided in the air intake and exhaust hole forming area.

5. The cooling structure as claimed in claim 1,
   wherein the electronic device includes an electronic device main part situated above the air ventilation part,
   a cooling object of the air ventilation part is provided at the electronic device main part,
   an air intake and exhaust hole forming area is formed in an area occupying an upper one third through one fourth of a side surface of the electronic device main part, and
   the air intake and exhaust hole forming part is formed in the air intake and exhaust hole forming area.

6. The cooling structure as claimed in claim 5,
   wherein a numerical aperture of the air intake and exhaust hole forming part in the air intake and exhaust hole forming area is 20% through 40%.

7. The cooling structure as claimed in claim 5,
   wherein an electromagnetic wave shielding member, configured to shield against the leakage of an electromagnetic wave to the outside of the electronic device, is provided in the air intake and exhaust hole forming area.

8. The cooling structure as claimed in claim 1,
   wherein the electronic device further includes:
   a temperature sensing part configured to sense a temperature inside of the electronic device; and
   an air ventilation control part configured to control an operation of the air ventilation part, so that the temperature of the inside of the electronic device sensed by the temperature sensing part becomes equal to a designated operation guarantee temperature.

9. The cooling structure as claimed in claim 8,
   wherein the air ventilation part is a fan,
   the air ventilation control part increases the number of rotations of the fan when the temperature of an inside of the electronic device is higher than the operation guarantee temperature, and
   the air ventilation control part decreases the number of rotations of the fan when the temperature of the inside of the electronic device is lower than the operation guarantee temperature.

10. The cooling structure as claimed in claim 8,
    wherein the temperature sensing part is provided on an upper part of the electronic device, and senses a temperature of inside air of the electronic device.

11. The cooling structure as claimed in claim 8,
    wherein the temperature sensing part is fixed to an electronic part provided inside of the electronic device, and senses a temperature of the electronic part.

12. A cooling method for electronic equipment including a plurality of electronic devices superposed on each other, a first one of the electronic devices having a structure where an air intake and exhaust hole forming part is formed at an upper part of the first electronic device, the electronic equipment being cooled by ventilating air into or out of the electronic devices, the cooling method comprising the step of:
    controlling the ventilation of the air in the first electronic device by taking air outside of the electronic equipment into an inside of a second one of the electronic devices superposed on the first electronic device via the air intake and exhaust hole forming part or exhausting air inside of the first electronic device to the outside of the electronic equipment via the air intake and exhaust hole forming part, so that the temperature of the inside of the first electronic device sensed by a temperature sensing part becomes equal to a designated operation guarantee temperature.

* * * * *